Oct. 6, 1970 H. KNIRSCH 3,533,019
SYSTEM FOR SWITCHING HIGH-FREQUENCY SIGNAL SOURCES
Filed Dec. 10, 1968
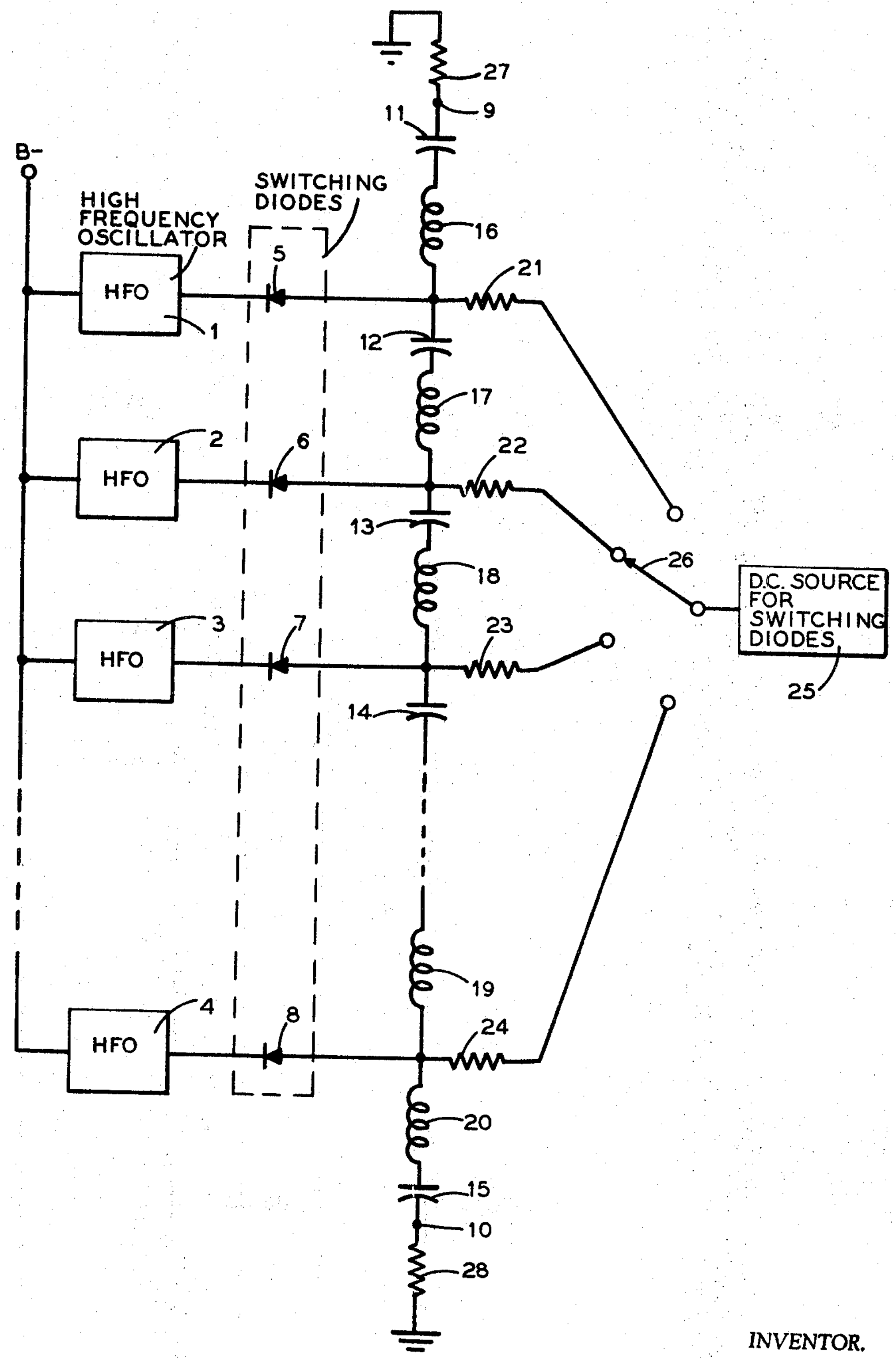
INVENTOR.
Herbert Knirsch
BY [signature]
ATTORNEY United States Patent Office 3,533,019
Patented Oct. 6, 1970

3,533,019

SYSTEM FOR SWITCHING HIGH-FREQUENCY SIGNAL SOURCES

Herbert Knirsch, Erding-Klettham, Germany, assignor to Schlumberger Overseas Messgeratebau und Vertrieb G.m.b.H., Munich, Germany, a corporation of Germany Filed Dec. 10, 1968, Ser. No. 782,690
Claims priority, application Germany, Dec. 11, 1967, 1,298,591
Int. Cl. H01p *1/10;* H03k *17/74*
U.S. Cl. 333—7 6 Claims

ABSTRACT OF THE DISCLOSURE

A plurality of high-frequency sources each producing a different dominant output frequency are connected in parallel with one another and are selectively connected to two output terminals of a transmission line common to all of said sources by rendering conductive an associated one of a plurality of semiconductor switches, also connected in parallel with respect to each other. To compensate for the reactive effect of the junction capacitance of the switches which are not rendered conductive, an inductive impedance associated with each switch is placed in the transmission line. DC isolation between switches is obtained by placing a blocking capacitance in series with each inductive impedance.

This invention relates generally to a system for selectively connecting one of a plurality of high frequency signal generators or sources to at least one output terminal which is common to all the sources and more particularly, this invention relates to a system for rapidly switching from one high-frequency signal generator to another without appreciable attendant losses.

Applications for the instant invention include electrical apparatus such as frequency synthesizers because such synthesizers typically uitlize a plurality of high-frequency signal sources formed by individual high-frequency oscillators. In such applications, it is sometimes necessary that each oscillator be tuned to generate a different dominant frequency and that provision be made to select any one of such frequencies and have that selected frequency appear as the only dominant frequency at the synthesizer output terminal or terminals.

An obvious solution to the problem would be to connect respective ones of the oscillators, by way of a mechanical switch, to common output terminals of the synthesizers, but this solution suffers various drawbacks, among which being that such switches are usually relatively slow in operation and become increasingly complex as the frequencies which are to be switched thereby increase. Thus, when the oscillator frequencies are in high frequency ranges, that is, on the other order 100 to 1000 mHz., mechanical switches usually become extremely complicated and expensive mechanisms. If, in addition, it is required that the switching be executed by remote control, for example, in accordance with a program stored on perforated cards and/or tapes, the complexity of mechanical switches is even further increased.

It is conventional to use parallel electronic switches, such as semiconductor diodes, to selectively switch time-varying signals to an output terminal or terminals. However, for frequencies on the order of 100–1000 mHz., the junction capacitance of, for example, nine parallel-connected and nonconductive (or reverse-biased) diodes would dampen or attenuate the signal which is delivered by the tenth conductive (or forward-biased) diode to such an extent that at least one additional amplifier stage would usually have to be connected to the synthesizer output terminals to at least partially restore the magnitude of the selected frequency. As will be apparent to those in the art, high frequency amplifier stages suitable for this purpose incorporate relatively sophisticated and expensive circuitry and additionally may be highly temperature-dependent.

It is an object of this invention to provide a new and improved system for rapidly applying one of a plurality of high-frequency signals to at least one system terminal.

Another object of this invention is to provide a high-speed circuit for selectively connecting the output of one of a plurality of high-frequency sources to a pair of terminals common to all such sources without appreciable attenuation or reflection.

The system constructed according to the instant invention provides a relatively uncomplex and inexpensive solution to the problem of switching a plurality of high-frequency signals. More specifically, use is made of a plurality of switching diodes, so that the possibility of rapid and, if desired, remotely and/or program-controlled switching is realizable. At least one reactance element is coupled to the output terminals of the transmission line. between the high-frequency signal sources and the system terminals.

Preferably, the additional reactance elements are selected, so that the resulting characteristic impedance can be readily and easily matched by other electronic stages coupled to the output terminals of the transmission line. For frequency synthesizers applications, practically loss-free inductors have been found to be suitable as reactance elements. In the simplest form, one inductor is connected between two parallel-connected switching diodes.

In the instant system, a galvanic coupling may occur between the junctions and specifically the anode junctions of switching diodes which are connected to the transmission line. Isolation between such diodes is effected by connecting a DC blocking capacitor in series with each inductor. Depending upon the size of the blocking capacitors needed to obtain good isolation, the capacitive reactance thereof may have to be taken into consideration in determining the total characteristic impedance of the line. In order to avoid signal attenuation or reflection in the line, the line has at least one end thereof terminated by an impedance which is selected to be equal to the total characteristic impedance of the line. Since the total characteristic impedance may be practically entirely resistive, the impedance may comprise a single resistor.

For a better understanding of the instant invention, together with other and further objects thereof, reference may be had to the following description taken in connection with the single accompanying drawing which is a schematic of a system constructed in accordance with the instant invention.

Referring now to the drawing, there is shown a schematic circuit diagram of the instant system as typically utilized in a frequency synthesizer. It will be understood, however, that the instant invention while particularly adaptable to this field of application is not restricted thereto, but finds uility in other applications requiring rapid and practically lossless switching between high-frequency signal generators.

Exemplary of suitable sources of different high-frequency signals are differently tuned oscillators, comprising a power amplifier having a voltage-controlled varactor, not shown, in each amplifier feedback circuit. The oscillators are designed generally by the letters HFO and more specifically by the numerals 1, 2, 3 . . . 4. The DC control voltage for the varactors is derivable from a suitable source of potential of B-volts. The oscillators 1, 2, 3 . . . 4, of the amplifier thereof, are connected by way of conventional high-speed switching diodes or transistors designated 5, 6, 7 . . . 8, respectively, to common coaxial output terminals 9 to 10. Preferably, the diodes 5, 6, 7 . . . 8 are matched as closely as practical to one another and are biased into conduction one at a time so that the output of only one oscillator at a time is coupled to the output terminals 9 and 10. The positive voltage required to bias the diodes into conduction is applied to the anode junctions of the diodes through respective resistors 21, 22, 23 . . . 24 which may be identical, from a source of positive DC voltage 25. Switching means depicted as a single pole switch 26 may be driven by remote and/or programmed apparatus, not shown, to selectively apply to one of the resistors 21, 22, 23 . . . 24 a diode-switching potential from the source 25. While illustrated as being a simple mechanical switch, the selective switching means typically comprises an electronic switch or gate, such as a high-speed transistor, which not only may be turned on to rapidly connect one of the resistors to the source 25 but further may be easily controlled by signals derived from remote equipment.

Since all the switching diodes 5, 6, 7 . . . 8 are connected in parallel, the junction capacitance of the various diodes is additive and would therefore present a relatively large capacitive load to the output terminals 9 and 10. By connecting equal-valued inductances between each two adjacent diodes, the junction capacitance of adjacent diodes is effectively decoupled from the transmission line and only resistive loads, which are more constant with frequency, are seen at the output terminals 9 and 10. Thus, as seen in the drawing, inductors 17, 18 . . . 19 are connected between each of two switching diodes, so that two adjacent diodes, for example the diodes 6 and 7, in combination with one inductor, in this example the inductor 18, form a pi network. Since the diode-switching voltage is a DC voltage, to isolate on the one hand, the diodes which are not conductive from the conductive diode, and, on the other hand, the terminals 9 and 10 against the switching voltage derived from the source 25, DC blocking capacitors 11, 12, 13 . . . 14 are series-connected to one end of the inductors 16, 17, 18 . . . 19, respectively.

The capacitors 11, 12, 13 . . . 14 are selected to pass without appreciable attenuation the high-frequency signal output obtained from a selected one of the oscillators to the output terminals 9 and 10. In order to prevent reflections at the output terminals one, and preferably both terminals 9 and 10 are connected to ground potential by way of an impedance. The terminal impedances may comprise resistors 27 and 28 selected such that each has a resistance value equal to the characteristic impedance of the line.

Appropriate resistance values for the resistors 27 and 28 may be obtained using the standard transmission line Equation: Z (the characteristoic line impedance) $=\sqrt{L/C}$ once the average junction capacitance (C) of a blocked or nonconductive diode is ascertained. Typically, the resistance (Z) of each resistor 27 and 28 is on the order of 75 ohms.

Having available two output terminals 9 and 10 is advantageous particularly if the aforedescribed system is to be used in frequency synthesizer applications because the output frequency generated by the selected oscillator usually must be delivered to two other, subsequent stages. In view of the foregoing, it will be evident that ohmic loses in the instant system may be made negligibly small while damping of a selected frequency and interferences between respective frequency sources is practically eliminated.

What is claimed is:

1. A system for selectively connecting one of a plurality of high frequency signal sources to at least one system terminal common to all of said sources, the system comprising, a plurality of switching devices having conductive and nonconductive states and capacitive reactance to high-frequency signals, each of said devices being coupled to a different one of said high-frequency sources, a transmission line coupled to said terminal and commonly connecting said devices, said transmission line including a plurality of inductors with each of said inductors coupled between different ones of said devices and a capacitor in series with each of said inductors for providing DC isolation between said different ones of said devices, and impedance means coupled to said terminal and having a characteristic impedance which is a function of the capacitance of one of said devices while the one device is in a nonconductive state and the inductance of an inductor electrically associated therewith.

2. The system as claimed in claim 1, wherein said devices are diodes.

3. The system as claimed in claim 1, wherein each of the devices and each associated inductor are coupled together at a junction and wherein the system further comprises, a plurality of equal-valued resistors, each resistor being connected to a different one of the junctions, and means for selectively applying a signal to one of said resistors for rendering one of said devices conductive.

4. The system as claimed in claim 3, wherein said devices are matched, plural-junction diodes having equal average values of junction capacitance.

5. The system as claimed in claim 1, wherein said devices are connected to form two parallel branches of a pi impedance network, the third branch including one of said inductors and one of the capacitors in series therewith.

6. The system as claimed in claim 5, wherein different ones of said frequency sources are connected in different ones of said parallel branches and further wherein a resistor is coupled to the junction formed by each of said parallel branches and said third branch, and means for selectively applying a DC signal to one of said resistors for driving an associated device from the nonconductive to the conductive state, whereby the signal of an associated one of said high-frequency sources is transmitted by said transmission line to said one terminal.

References Cited

UNITED STATES PATENTS

| | | | |
|---|---|---|---|
| 3,354,435 | 11/1967 | Picciano | 333—7X |
| 3,223,947 | 12/1965 | Clar | 333—7 |

FOREIGN PATENTS

| | | |
|---|---|---|
| 1,108,671 | 4/1968 | Great Britain. |

PAUL L. GENSLER, Primary Examiner

U.S. Cl. X.R.

307—243, 259; 331—49